United States Patent
Bhattacharyya

(10) Patent No.: US 7,019,378 B2
(45) Date of Patent: Mar. 28, 2006

(54) FIELD-SHIELDED SOI-MOS STRUCTURE FREE FROM FLOATING BODY EFFECTS, AND METHOD OF FABRICATION THEREFOR

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 77 days.

(21) Appl. No.: 10/859,543

(22) Filed: Jun. 3, 2004

(65) Prior Publication Data

US 2005/0258490 A1    Nov. 24, 2005

Related U.S. Application Data

(62) Division of application No. 09/984,778, filed on Oct. 31, 2001, now Pat. No. 6,933,572.

(51) Int. Cl.
*H01L 21/20* (2006.01)

(52) U.S. Cl. .................. 257/479; 438/400; 257/349

(58) Field of Classification Search ............ 438/433, 438/424, 400, 479; 257/347, 349
See application file for complete search history.

(56) References Cited

U.S. PATENT DOCUMENTS 3,978,577 A * 9/1976 Bhattacharyya et al. .... 438/275

OTHER PUBLICATIONS

"Scalability of SOI Technology into 0.13 um 1.2 V CMOS Generation," E. Leobandung, et al., IEDM, 1998, pp. 403-406.
"SOI and Device Scaling," C. Hu, Proceedings of IEEE International SOI Conference, Oct. 1998, pp. 1-4.
"SOI Floating-Body, Device and Circuit Issues," J. Gautier, et al., IEDM, 1997, pp. 407-410.
"CAD-Compatible High-Speed CMOS/SIMOX Gate Array Using Field-Shielded Isolation," T. Iwamatsu, et al., IEEE Trans. Elec. Devices, vol. 42, No. 11, 1995, pp. 1934-1938.
"Suppression of Delay Time Instability on Frequency using Field Shield Isolation Technology for Deep Sub-Micron SOI Circuits," S. Maeda, et al., IEDM, 1996, pp. 129-132.

(Continued)

*Primary Examiner*—Bradley K. Smith
(74) *Attorney, Agent, or Firm*—Dickstein Shapiro Morin & Oshinsky, LLP

(57) ABSTRACT

A silicon-on-insulator structure provides an effective drift field for holes, and simultaneously enhanced recombination centers for holes and electrons. The structure includes a silicon substrate, an oxide insulation layer disposed above the silicon substrate, a silicon body layer disposed above the oxide insulation layer, and a field shield gate disposed above the silicon body layer. The field shield gate includes a conductor portion, and an alumina insulation layer disposed beneath the conductor portion. The oxide insulation layer and the silicon body layer each include at least one channel stop region, and at least one recombination center for the recombination of positive- and negative-charge carriers. The effective drift field and enhanced recombination centers facilitate the rapid recombination of the charge carriers, leading to a very small recombination time constant, which overcomes the floating body effect associated with conventional silicon-on-insulator structures.

14 Claims, 7 Drawing Sheets

OTHER PUBLICATIONS

"BESS: A Source Structure that Fully Suppresses the Floating Body Effects in SOI CMOSFETs," M. Horiuchi, et al., IEDM 1996, pp. 121-124.

"A Novel SiGe-Inserted SOI Structure for High Performance PDSOI CMOSFETs," G.J. Bae, et al., IEDM, 2000, pp. 667-670.

* cited by examiner

FIELD-SHIELDED SOI-MOS STRUCTURE FREE FROM FLOATING BODY EFFECTS, AND METHOD OF FABRICATION THEREFOR

This application is division of application Ser. No. 09/984,778, filed on Oct. 31, 2001 now U.S. Pat. No. 6,933,572.

BACKGROUND OF THE INVENTION

1. Field of the Invention

This invention relates generally to the field of semiconductor memory and logic devices. The invention relates more specifically to a silicon-on-insulator structure, and a method of fabrication therefor.

2. Description of the Related Art

In the field of microelectronics, SOI (Silicon-on-Insulator)-CMOS technology has been demonstrated to have significant speed, power, and radiation immunity advantages over bulk CMOS technology. See, e.g., "Scalability of SOI Technology into 0.13 um 1.2 V CMOS Generation," E. Leobandung, et al., *IEDM*, 1998, pp. 403–406, and "SOI and Device Scaling," C. Hu, *Proceedings of IEEE International SOI Conference*, Oct. 1998, pp. 1–4.

SOI-CMOS technology, however, has yet to be widely accepted by the systems and circuit design communities because of the complexity of managing an anomalous effect termed the "floating body effect" (hereinafter "FBE"), of the SOI devices, and in particular, of NFET-SOI devices. Unlike bulk NMOSFET devices, in which the body is tied to either a fixed potential or to the source of the device, body potential in NMOSFET-SOI devices is floating, and remains unstable due to the complex dynamics of both positive-charge carrier, or "hole," generation by impact ionization at the drain edge, and by recombination and diffusion. As a result of this floating potential, NMOSFET-SOI devices exhibit several undesirable characteristics, such as a "kink effect" (current enhancement) in the Id-Vg characteristics of the device, enhanced leakage attributable to parasitic (npn) bipolar junction transistor (BJT) current, and enhanced 1/f noise. In addition, circuit-related drawbacks attributable to FBE include threshold instability, hysterectic behavior in signal input/output, frequency dependent pulse delays, and signal pulse width modulation. The parasitic bipolar current adversely affects memory sense and write operations (in SRAM memory) as well as data retention (in SDRAM memory). "SOI Floating Body, Devices, and Circuit Issues," J. Cautier, et al., IEDM, 1997, pp. 407–410.

In logic design, such drawbacks can lead to data loss and dynamic circuit failure, as well as timing delays. Additionally, analog circuit applications may be seriously limited due to transistor mismatch and enhanced AC/DC noise. Therefore, overcoming FBE is a major obstacle to the widespread application of SOI-CMOS.

Several solutions have been proposed to suppress FBE. For example, with field shield isolation technology, FBE has been minimized for SOI-NFET gate arrays by using a field shielded gate and by collecting excess holes via the body contact under the field shield. "CAD-Compatible High-Speed CMOS/SIMOX Gate Array Using Field-Shield Isolation," T. Iwamatsu, et al., *IEEE Trans. Elec. Devices*, Vol. 42, No. 11, 1995, pp. 1934–1938. In addition, by using a field shielded gate, it has been demonstrated that delay time instability of logic circuits can be suppressed over a particular frequency range. "Suppression of Delay Time Instability on Frequency Using Field Shield Isolation Technology for Deep Submicron SOI Circuits," S. Maeda, et al., *IEDM*, 1996, pp. 129–132.

In another approach, a bipolar embedded source structure (BESS) has been employed to suppress FBE. "BESS: A Source Structure that Fully Suppresses the Floating Body Effects in SOI CMOSFETs," M. Horiuchi, et al., IEDM, 1996, pp. 121–124. In the BESS approach, FBE is suppressed by creating a recombination region (collector) for holes and by shunting the holes via a low built-in potential barrier region (n-base). The structure is created below the n+ source region between the SOI/BOX (buried oxide) interface, whereby the p-type body of the SOI-NFET acts as the source of holes (i.e., an emitter). The BESS approach has been shown to suppress FBE and improve DIBL (drain induced barrier lowering), an undesirable device characteristic.

In still another approach, using a Si—Ge inserted SOI, a graded thin layer of Si—Ge is epitaxially inserted into a p-type silicon body toward its bottom, close to the BOX region. "A Novel Si—Ge Inserted SOI Structure for High Performance PDSOI CMOSFET," G. T. Bae, et al, *IEDM*, 2000, pp. 667–670. This creates a narrow band gap region (the band gap of Ge is 0.66 ev compared to a band gap of 1.12 ev for Si) in the body and lowers body-source potential barrier to hole current without affecting the FET channel characteristics. As a result, the parasitic bipolar current gain is reduced, and hole recombination at the n+Si—Ge (source-element)/p–Si—Ge (body element) region is enhanced.

In each of the above-described prior art approaches to overcoming FBE, the central theme is to facilitate the recombination of the excess holes generated by impact ionization. That is, the objective is for the excess holes to be swept away and recombined by a mechanism (or combination of mechanisms) that yields a very small (i.e., a short, or faster) recombination time constant. If a very small time constant could be achieved, the body (e.g., the base of a parasitic BJT bipolar device) would never be charged sufficiently so as to trigger bipolar action. If such a dynamic equilibrium could be achieved for generation and recombination of holes, the body would maintain a constant low body potential regardless of the time constant and the mechanism of hole generation. Consequently, large hole generation would lead to a large recombination current and, therefore, a low gain (i.e., large base current) for a parasitic bipolar device. The resulting device would not exhibit a greater drain induced barrier lowering effect, and would not have reduced source to drain breakdown. Furthermore, circuits employed would not exhibit any hysteretic effects regardless of pulse frequency, or any excessive pass-gate leakage, or any data loss or pulse width modulation.

Therefore, a need exists for a solution to the floating body effect that can be achieved at the minimum increase in process complexity and the minimum impact on device density and other required device characteristics, such as device current, desired device leakage, and capacitance.

BRIEF SUMMARY OF THE INVENTION

The present invention provides a silicon-on-insulator structure free from floating body effects, and a method of fabrication therefor. More specifically, the present invention provides a structure capable of facilitating the enhanced recombination of charge carriers, which results in a greatly reduced recombination time constant.

Accordingly, the present invention relates to a structure having a field shield integration configuration that provides an effective drift field for holes and simultaneously enhanced recombination centers for positive-charge carriers (holes) and negative-charge carriers (electrons). The effective drift field and the enhanced recombination centers facilitate the rapid recombination of the charge carriers, leading to a very small recombination time constant. The structure comprises a silicon substrate, an oxide insulation layer disposed above the silicon substrate, a silicon body layer disposed above the oxide insulation layer, and a field shield gate disposed above the silicon body layer. The field shield gate includes a conductor portion, and an alumina insulation layer disposed beneath the conductor portion. The oxide insulation layer and the silicon body layer each include at least one channel stop region, and at least one recombination center for the recombination of positive- and negative-charge carriers.

The present invention also relates to a method of fabricating the above-described silicon-on-insulator structure. The method comprises providing an oxide insulation layer on a silicon substrate; providing on the oxide insulation layer a shallow trench isolation configuration of a silicon body layer; providing on a portion of the silicon body layer an alumina insulation layer of a field shield gate; providing on the alumina insulation layer a conductor portion of the field shield gate; and providing through ion implantation at least one channel stop region and at least one recombination center in each of the silicon body layer and the oxide insulation layer. By conducting the oxidation of the alumina insulation formation layer in a moist environment, a highly controlled negative charge at the alumina insulation layer-silicon body layer interface can be achieved, which provides an effective drift field. The enhanced recombination center is produced by ion implantation of either silicon, nickel, or cobalt deep inside the silicon body layer. The elements silicon, nickel, or cobalt provide deep electron and hole energy states within the bandgap of the silicon body layer, thereby creating deep recombination centers for electrons and holes.

By virtue of the aforementioned features and other features described herein, the present invention provides a silicon-on-insulator structure with a recombination time constant substantially smaller than that associated with conventional structures and methods, thereby overcoming the floating body effect.

BRIEF DESCRIPTION OF THE DRAWINGS

Other features and advantages of the present invention will become more fully apparent from the following detailed description of the exemplary embodiments of the invention which are provided in connection with the accompanying drawings.

DETAILED DESCRIPTION OF THE INVENTION

The present invention will be understood from the exemplary embodiments described herein.

The present invention provides a field shield integration configuration that offers simultaneously enhanced recombination centers for positive-charge carriers (holes) and negative-charge carriers (electrons), and an effective drift field for holes (not required for electrons due to their inherent high mobility). The effective drift field and the enhanced recombination centers facilitate the rapid recombination of the charge carriers, leading to a very small recombination time constant. The present invention, therefore, overcomes the conventional slow thermal recombination mechanism or the diffusion time constant associated with hole recombination at the body contact.

Figure 2:
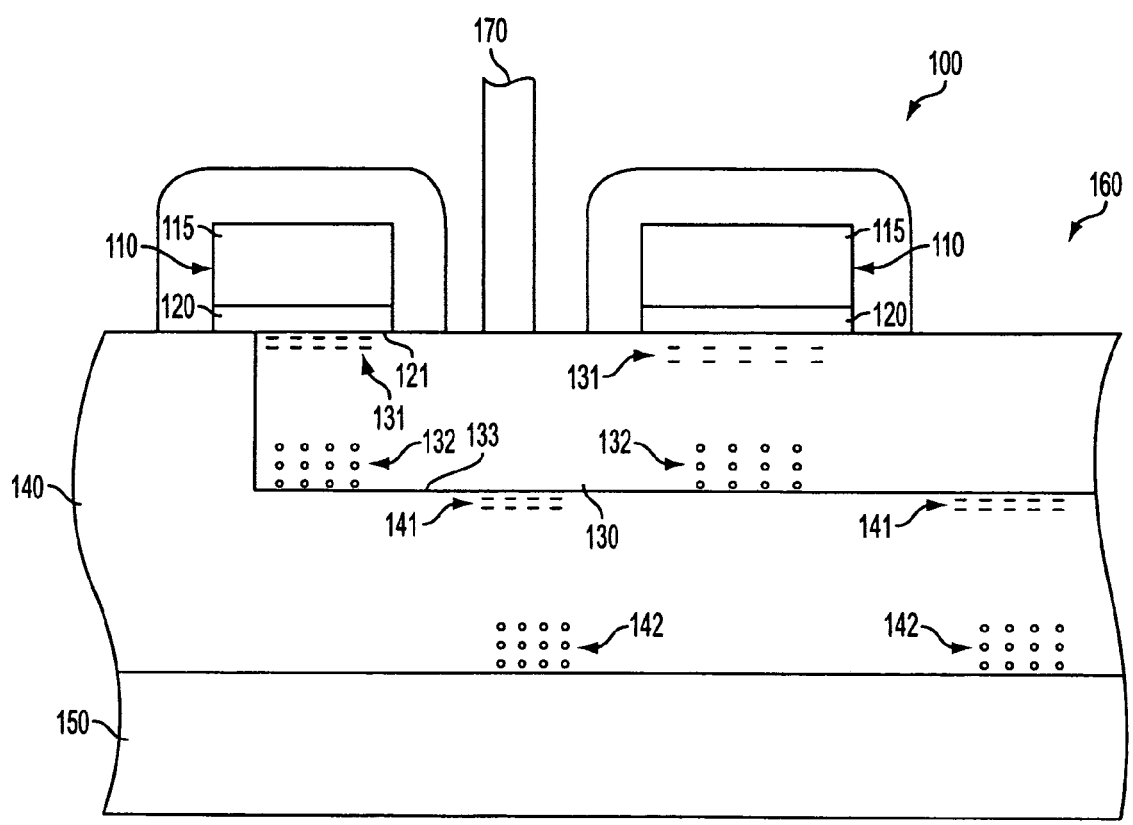
FIG. 2 is a partial cross-sectional view of an SOI structure constructed in accordance with the present invention.

FIG. 2 is a partial cross-sectional view of a structure 100 constructed in accordance with one embodiment of the present invention. Structure 100 can be, for example, a structure such as a semiconductor wafer. Structure 100 comprises a silicon substrate 150; an oxide insulation layer 140 disposed above the silicon substrate 150; a silicon body layer 130 disposed above the oxide insulation layer 140; and a field shield gate 110 disposed above a portion of the silicon body layer 130. The field shield gate 110 includes a conductor portion 115, and an alumina insulation layer 120 disposed beneath the conductor portion 115. Structure 100 also includes body contact 170. The silicon body layer 130 includes at least one channel stop region 131 and at least one recombination center 132 for the recombination of positive- and negative-charge carriers. The at least one channel stop region 131 and the at least one recombination center 132 are laterally located beneath the field shield gate 110. The conductor portion 115 of field shield gate 110 comprises a material that functions electrically like a metal because it is heavily doped, i.e., a degenerate semiconductor. The conductor portion 115 comprises a material that is capable of being accommodated by the process of fabricating the structure 100. Thus, for purposes of process integration, the conductor portion 115 is typically polysilicon. The silicon body layer 130 may comprise either p- or n-conductivity type silicon.

In an active device region 160, the oxide insulation layer 140 includes a channel stop region 141 and a recombination center 142 for the recombination of positive and negative-charge carriers. Since the channel stop region 141 and the recombination center 142 are both embedded inside the oxide insulation layer 140 in the active device region 160, they do not affect the device profiles, and consequently device characteristics. The channel stop region 141 and the recombination center 142 can also be present in the oxide insulation layer 140 beneath body contact 170.

The method of fabricating structure 100 comprises providing the oxide insulation layer 140 on the silicon substrate 150; providing on the oxide insulation layer 140 a shallow trench isolation configuration of the silicon body layer 130; providing on a portion of the silicon body layer 130 the alumina insulation layer 120 of the field shield gate 110; providing on the alumina insulation layer 120 the conductor portion 115 of the field shield gate 110; and providing, through ion implantation, the channel stop regions 131 and 141 and the recombination centers 132 and 142 in each of the silicon body layer 130 and the oxide insulation layer 140.

The presence of the channel stop region 141 and the recombination center 142 is a consequence of the formation of the channel stop region 131 and the recombination center 132. The channel stop region 141 and the recombination center 142 have no electrical consequence, however, since channel stop region 141 and recombination center 142 are embedded in the buried oxide layer 140. After the ion implantation step, the method of fabrication further comprises standard device processing, such as, for example, active NFET and PFET device processing, body contact and other contact processing, and interconnect and back-end-of-line processing, as is well known in the art.

In the present invention, two factors determine the ability of the holes to recombine with a small recombination time constant. The first factor is the presence of an effective drift field, and the second factor is the presence of the enhanced recombination center 132. The first factor, an effective drift field, is realized through use of the field shield gate 110, which unlike a standard gate oxide, includes a layer 120 of alumina ($Al_2O_3$) insulation. The alumina insulation layer 120, which may be deposited by chemical vapor deposition (CVD) or atomic layer deposition (ALD), is deposited over the native hydrated oxide surface of the silicon body layer 130 (in a pre-gate insulator standard clean process). By conducting the oxidation in a moist environment, a highly controlled negative interface charge of approximately $3E^{13}/cm^2$ can be achieved at an alumina insulation layer 120-silicon body layer 130 interface 121. It is this negative interface charge which provides the effective drift field. As used herein, the term "moist" means an environment in which the partial pressure of the hydroxyl ion during oxidation is at least one millitorr.

Figure 1:
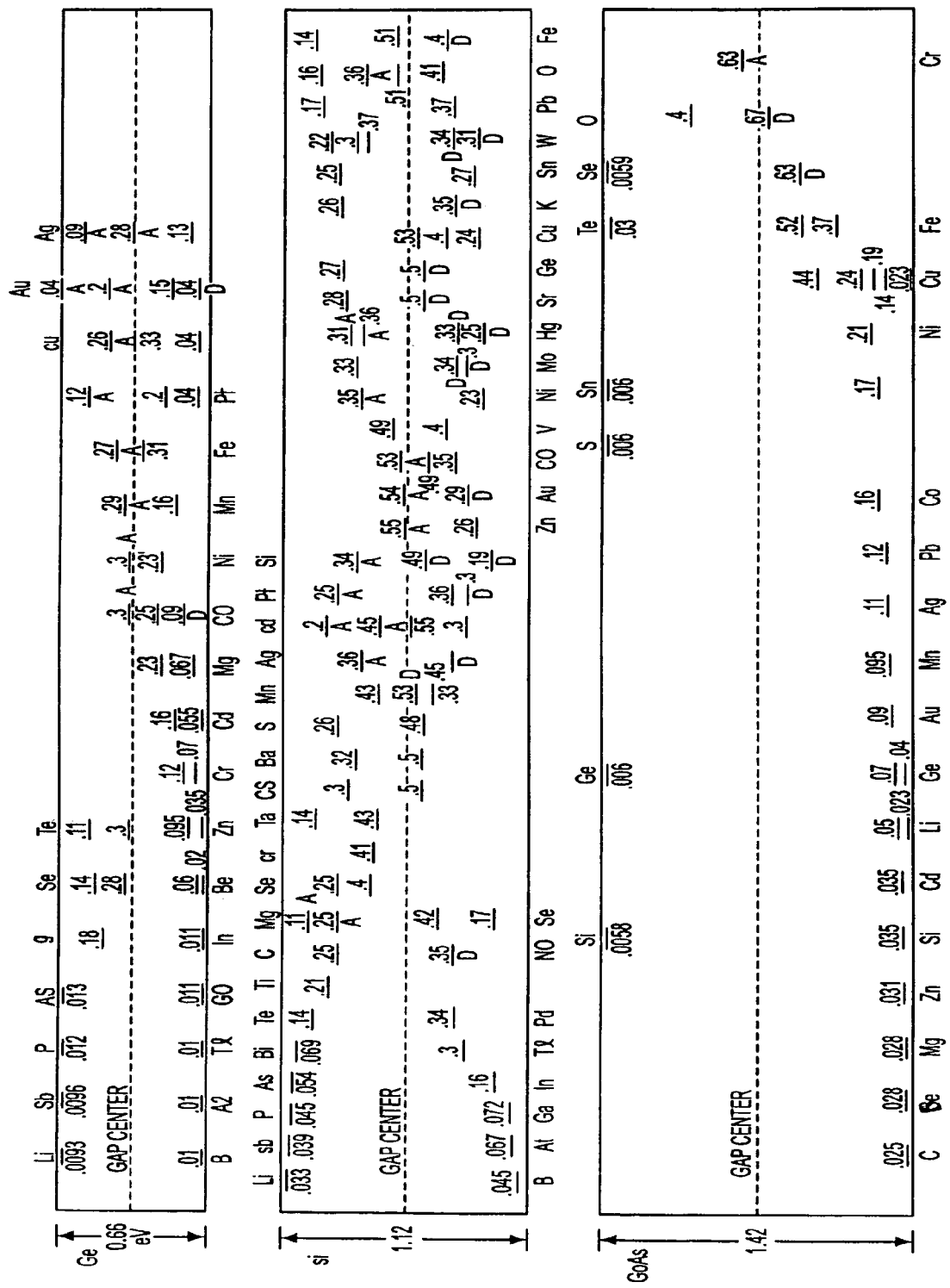
FIG. 1 is a graphical illustration of measured ionization energies for various impurities in Ge, Si, and GaAs.

The second factor, the presence of the enhanced recombination center 132, is based on the following. As depicted in FIG. 1 (from *Physics of Semiconductor Devices*, S. M. Sze, John Wiley & Sons, New York, 1981, p. 21), different ionization energy levels can be achieved by implanting different impurities in silicon. Species such as silicon (Si), nickel (Ni), and cobalt (Co) create a deep level of energy states, and therefore, deep-trap levels within the bandgap of silicon. Therefore, implanting any of silicon (i.e., intrinsic silicon), nickel, and cobalt within the body of p-type or n-type silicon will create a deep recombination center to facilitate the recombination of positive- and negative-charge carriers.

The presence of the enhanced deep recombination center 132 is achieved as follows. The deep recombination center 132 is produced in the silicon body layer 130, below the field shield gate 110, near the silicon body layer 130-oxide insulation layer 140 interface 133. The deep recombination center 132 is produced by ion implanting one of Si, Ni, or Co at an appropriate dose, typically about $1E^{15}/cm^2$, i.e., at an implantation energy sufficient to provide the desired depth of implantation. These species (Si, Ni, and Co), when implanted into silicon, provide both hole and electron recombination centers by generating deep states inside the silicon band gap. As used herein in conjunction with recombination center 132, the term "near" means the following. Producing the deep recombination center 132 in the silicon body layer 130 near the silicon body layer 130-oxide insulation layer 140 interface 133 means producing the deep recombination center 132 in the approximately lower one-third portion of the silicon body layer 130 (i.e., one-third the distance from interface 133 to interface 121). For example, in a silicon body layer 130 having a thickness of 1000 Å, the deep recombination center 132 would be located in the approximately lower 300 Å of the silicon body layer 130 nearest the interface 133.

The ion implantation to produce the recombination center 132 is performed through the field shield gate 110, and is performed concurrently with the implantation of the self-aligned channel stop region 131. The channel stop implantation employs a p-type impurity, such as, for example, boron or other p-type impurities, for a p-type silicon body layer 130. The channel stop implantation employs an n-type impurity, such as, for example, phosphorous or other n-type impurities, for an n-type silicon body layer 130. As shown in FIG. 2, the channel stop region 131 implantation is located near the alumina insulation layer 120-silicon body layer 130 interface 121 (i.e., the peak or maximum concentration point of the implantation is located near the alumina insulation layer 120-silicon body layer 130 interface 121. The purpose of the channel stop region 131 implantation is to adjust the equivalent threshold of the field shield gate 110. As used herein in conjunction with channel stop region 131, the term "near" means the following. Producing the channel stop region 131 in the silicon body layer 130 near the alumina insulation layer 120-silicon body layer 130 interface 121 means producing the channel stop region 131 in the approximately upper one-tenth portion of the silicon body layer 130 (i.e., one-tenth the distance from interface 121 to interface 133). The implantation energy that is employed to provide the channel stop region 131 implantation is that which is sufficient to provide the desired depth of implantation.

The recombination center 132 implantation is located near the silicon body layer 130-oxide insulation layer 140 interface 133. The purpose of the recombination center 132 implantation is to create deep recombination regions for electrons and holes.

The ability of the charge carriers to recombine with a small recombination time constant is attributable to the interaction between the negative interface charge at the alumina insulation layer 120-silicon body layer 130 interface 121, and the deep recombination center 132. The drift field generated by the negative charges near the interface 121 attracts holes, which are then recombined at the recombination center 132. (See FIG. 3.)

As indicated above, in the active device region 160 and beneath the body contact 170, the oxide insulation layer 140 includes the channel stop region 141 and the recombination center 142 for the recombination of positive- and negative-charge carriers. The presence of the channel stop region 141 and the recombination center 142 is a consequence of the formation of the channel stop region 131 and the recombination center 132. The channel stop region 141 and the recombination center 142 have no electrical consequence, however, and thus do not affect the device profiles, since channel stop region 141 and recombination center 142 are embedded in the buried oxide layer 140.

Figure 3:
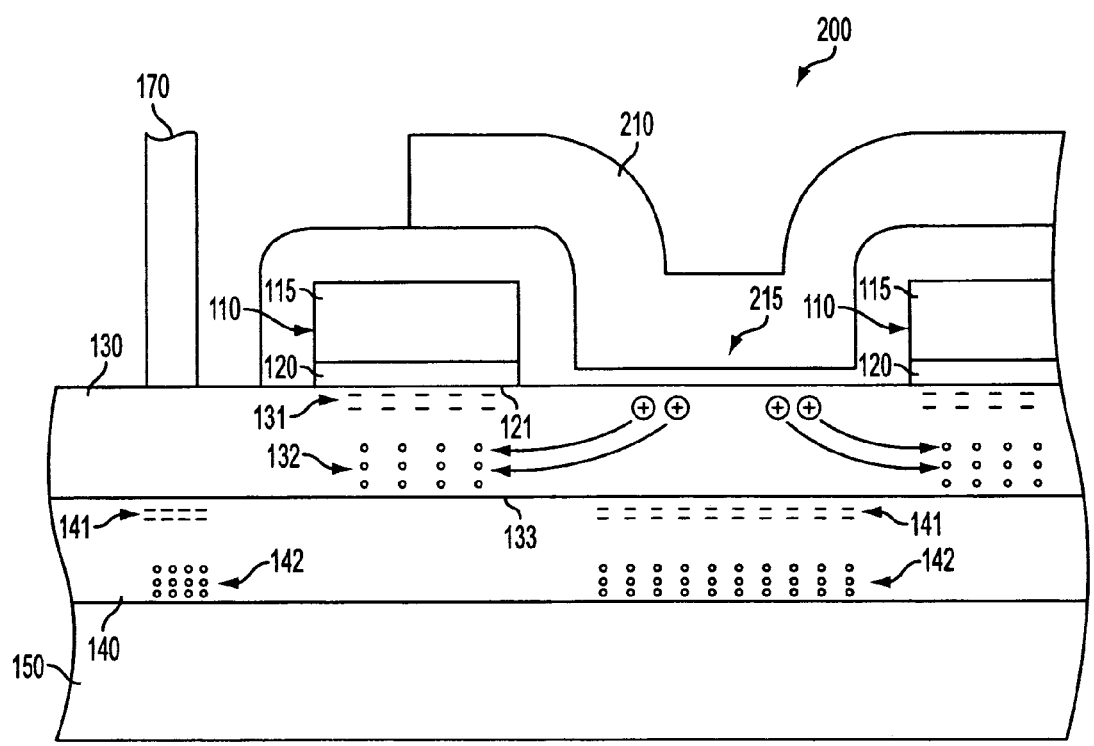
FIG. 3 is a partial cross-sectional view of an SOI-NFET active device embodiment of the structure depicted in FIG. 2.

FIG. 3 is a partial cross-sectional view of an SOI-NFET active device embodiment 200 of the structure 100 depicted in FIG. 2. In addition to the features depicted in FIG. 2, active device 200 includes an NFET active layer 210 of n+ polysilicon and active device gate 215. As indicated above, the drift field generated by the negative charges near the interface 121 attracts holes, such as those schematically depicted beneath the active device gate 215, which are then recombined at the recombination center 132.

Figure 4:
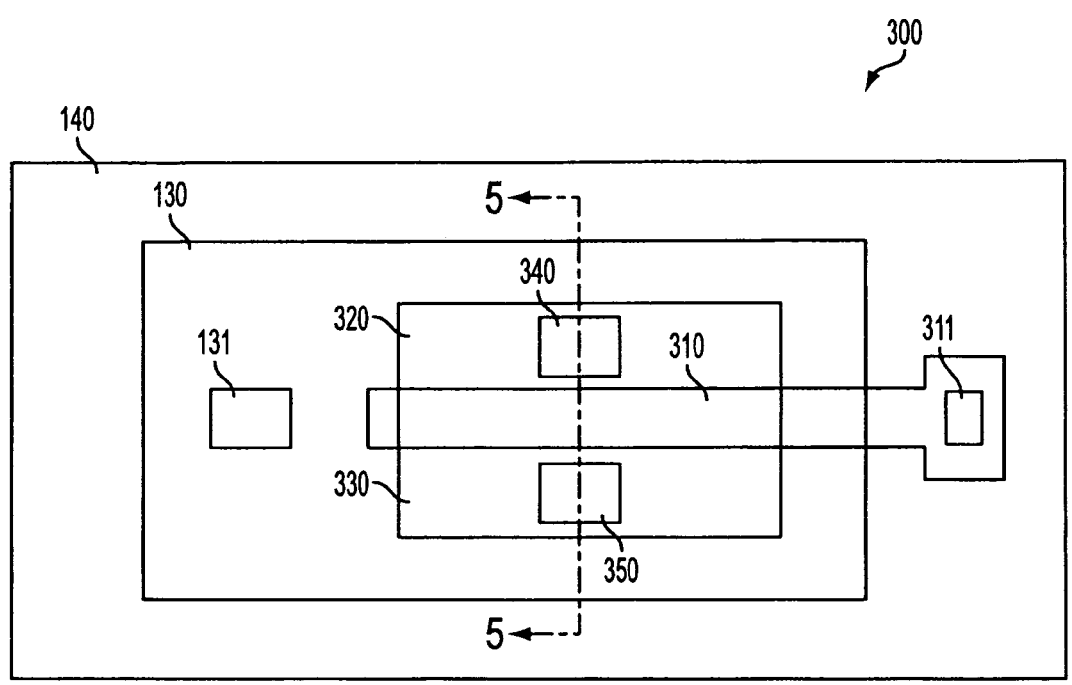
FIG. 4 is a plan view of an SOI-NMOSFET embodiment of the structure depicted in FIG. 2.
Figure 5:
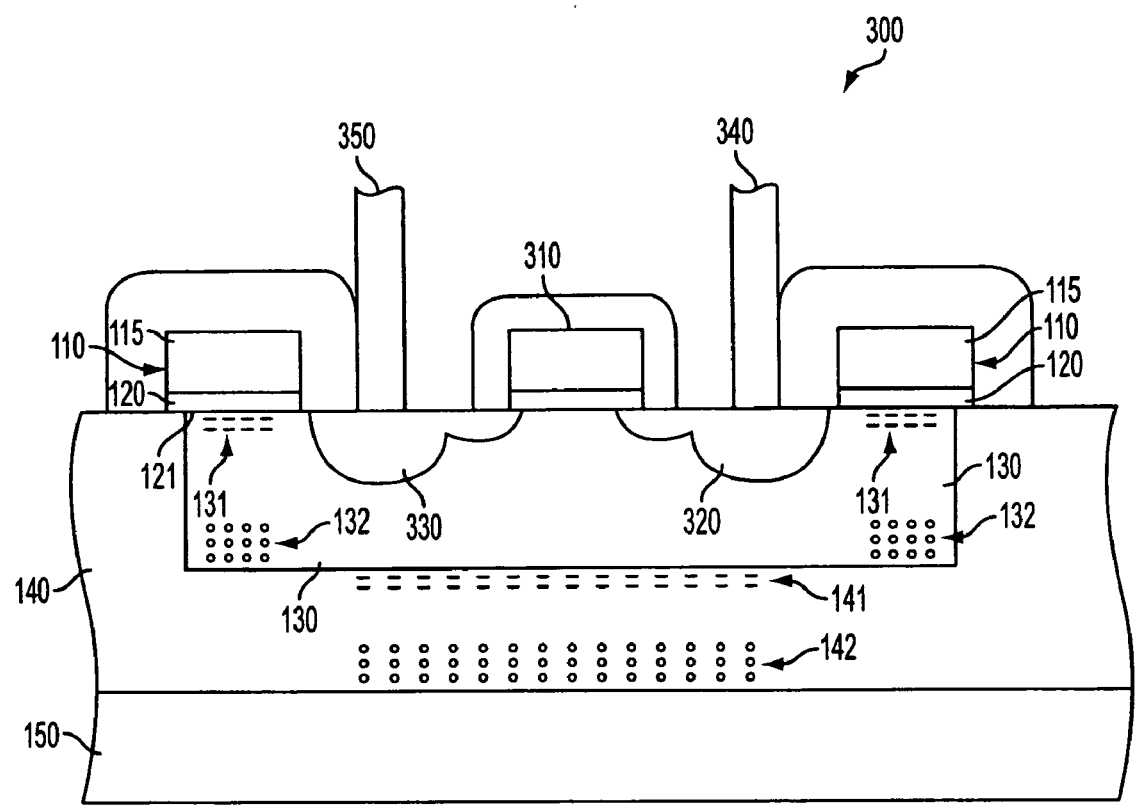
FIG. 5 is a partial cross-sectional view through the channel of the layout depicted in FIG. 4.

FIG. 4 is a plan view of the layout of an SOI-NMOSFET active device embodiment 300 of the structure depicted in FIG. 2. FIG. 5 is a partial cross-sectional view through the channel of the layout depicted in FIG. 4. In addition to the features depicted in FIG. 2, active device 300, which provides shallow trench isolation, includes active gate 310; active gate contact 311; n+ source 320; source contact 340; n+ drain 330; drain contact 350, and body contact 131.

Figure 6:
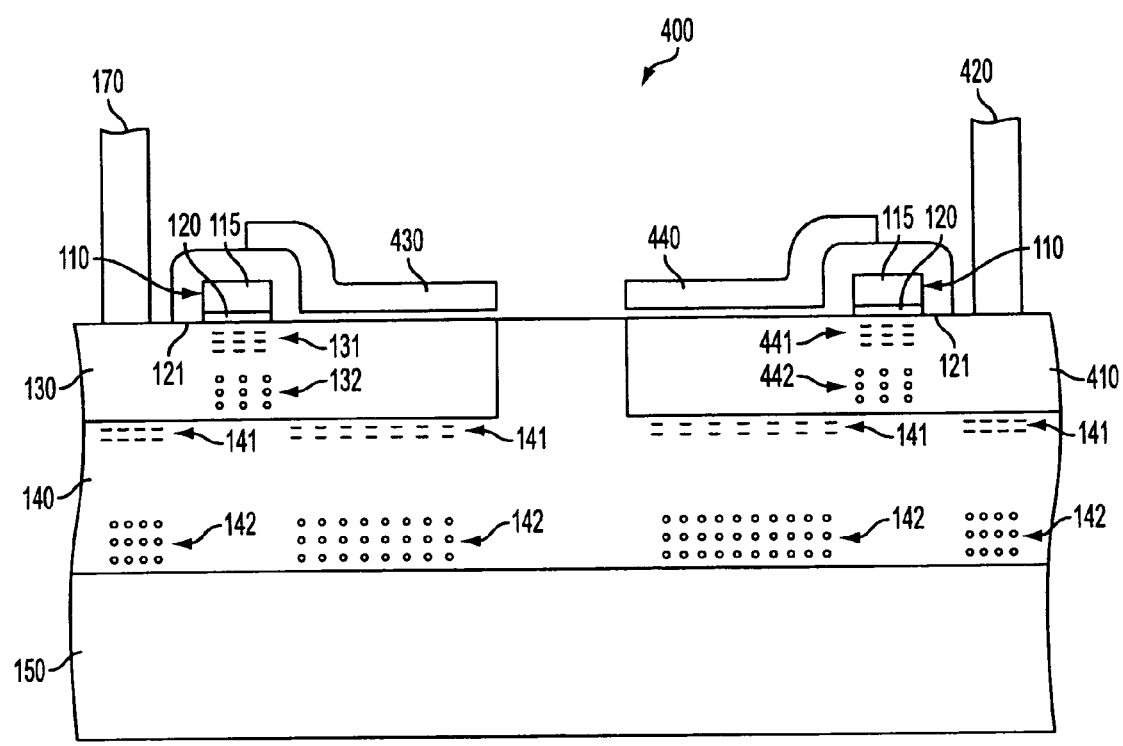
FIG. 6 is a partial cross-sectional view of an SOI-CMOS device embodiment of the structure depicted in FIG. 2.

FIG. 6 is a partial cross-sectional view of an SOI-CMOS active device embodiment 400 of the structure depicted in FIG. 2. In addition to the features depicted in FIG. 2, active device 400, which also provides shallow trench isolation, includes a silicon body layer 410 of a second conductivity type, such as an n-type, the silicon body layer 410 having a channel stop region 411 and a recombination center 412; an n-body contact 420; an NFET active device 430; and a PFET active device 440.

A chip produced from the structure 100 (or any of the above-described various embodiments thereof depicted in FIGS. 3–6) may be incorporated in any fabricated semiconductor device, including various processor system components, such as for example, a central processing unit (CPU) or in any of the various types of memory devices, such as for example, RAM, ROM, and others. It may also be used in any type of integrated circuit controller for a floppy disk, a hard disk, a ZIP, or a CD-ROM disk.

Figure 7:
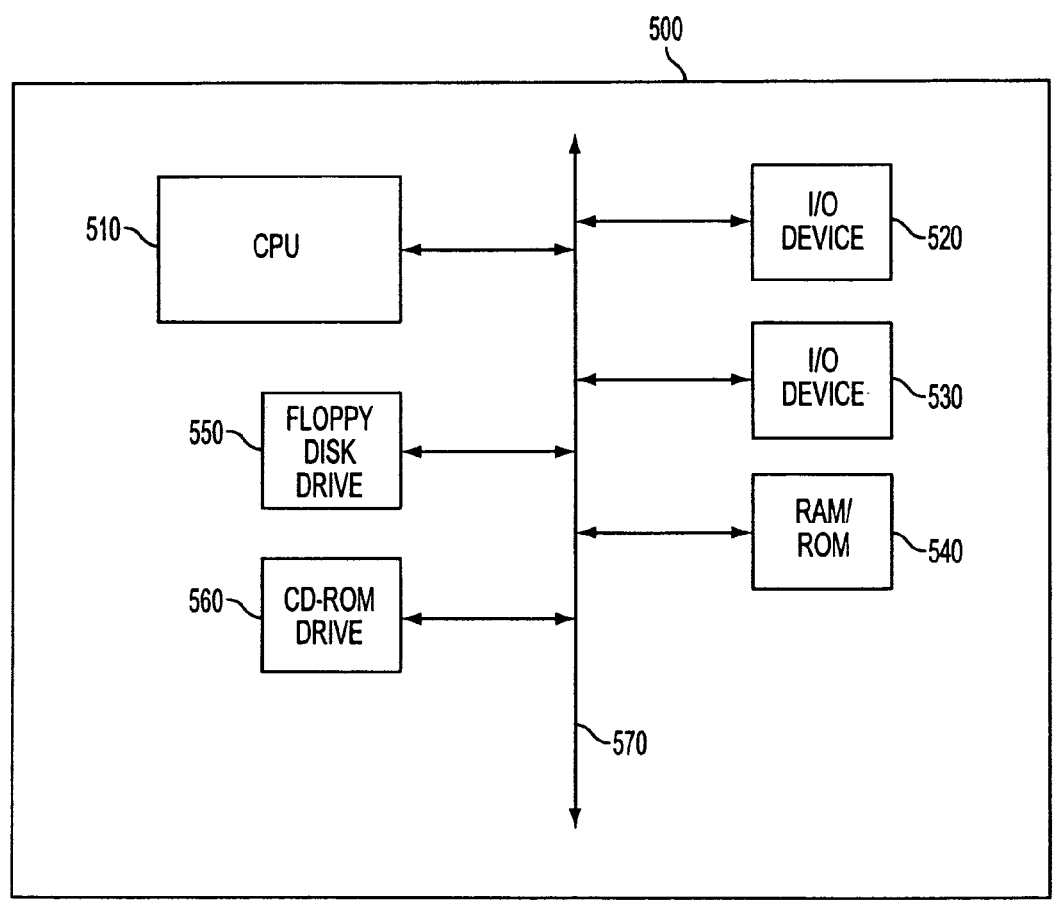
FIG. 7 is a block diagram of a system which employs a chip constructed in accordance with the structure depicted in FIG. 2.

FIG. 7 is a block diagram of a system 500 utilizing a chip produced from the structure 100. System 500 typically comprises a CPU 510. The system 500 may be a computer system, a process control system, or any other system employing a processor and associated memory, and may employ one or more buses and/or bridges which allow the CPU 510 to internally communicate with I/O devices 520, 530, random access memory (RAM) devices and read-only memory (ROM) devices 540, and peripheral devices such as a floppy disk drive 550 and a compact disk CD-ROM drive 560 that also communicate with CPU 510 over the bus 570, as is well known in the art. Any of the CPU 510, the memory devices, and controller elements or other illustrated electrical components may include a chip produced from the structure 100 (or any of the above-described various embodiments thereof depicted in FIGS. 3–6) in accordance with the claimed invention.

In still another embodiment of the invention, a chip produced from the structure 100 can be employed in a digital, telecommunication, and internet system, and associated device applications. The system comprises a digital processor; an analog device; a radio frequency device; and a memory device having memory such as RAM, ROM, NVRAM (non-volatile RAM), or flash. Any combination of the aforementioned devices and functions can be integrated into a chip produced using the structure 100.

The present invention, therefore, provides a structure capable of facilitating the enhanced recombination of charge carriers, which results in a recombination time constant that is substantially smaller than that associated with conventional structures and methods. By virtue of the features described herein, the invention provides scalability, performance and circuit designability over a wide range of application frequencies and power supplies. The invention also facilitates mixed signal circuit design (e.g., phase-locked loop), and can be used for memory and logic applications.

Although the invention has been described and illustrated as being suitable for use in a processor applications, for example, computer control systems, the invention is not limited to these embodiments. Rather, the invention could be employed in any system in which a small recombination time constant is desirable.

Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed is:

1. A method of fabricating a silicon-on-insulator structure, said method comprising:
   providing an oxide insulation layer on a silicon substrate;
   providing on said oxide insulation layer a shallow trench isolation configuration of a silicon body layer;
   providing on a portion of said silicon body layer an alumina insulation layer of a field shield gate;
   providing on said alumina insulation layer a conductor portion of said field shield gate; and
   providing through ion implantation at least one channel stop region and at least one recombination center in each of the silicon body layer and the oxide insulation layer.

2. The method according to claim 1, wherein said step of providing the alumina insulation layer comprises conducting the oxidation of aluminum in a moist environment.

3. The method according to claim 2, wherein said oxidation is conducted with a hydroxyl ion partial pressure of at least one millitorr.

4. The method according to claim 1, wherein said step of providing the alumina insulation layer imparts a negative electrical charge to the interface of the alumina insulation layer and the silicon body layer.

5. The method according to claim 4, wherein said negative electrical charge is about $3E^{13}/cm^2$.

6. The method according to claim 1, wherein said step of providing the channel stop region comprises implanting a p-type impurity for a p-type silicon body layer.

7. The method according to claim 6, wherein said step of implanting is effected at an implantation energy dose sufficient to implant the p-type impurity near the interface of the alumina insulation layer and the silicon body layer.

8. The method according to claim 6, wherein said p-type impurity is boron.

9. The method according to claim 1, wherein said step of providing the channel stop region comprises implanting an n-type impurity for an n-type silicon body layer.

10. The method according to claim 9, wherein said step of implanting is effected at an implantation energy dose sufficient to implant the n-type impurity near the interface of the alumina insulation layer and the silicon body layer.

11. The method according to claim 9, wherein said n-type impurity is phosphorous.

12. The method according to claim 1, wherein said step of providing the recombination center comprises implanting a material selected from the group consisting of silicon, nickel, and cobalt.

13. The method according to claim 12, wherein said step of implanting silicon, nickel, or cobalt is effected at an implantation energy dose sufficient to implant the silicon, nickel, or cobalt near the interface of the silicon body layer and the oxide insulation layer.

14. The method according to claim 13, wherein said implantation energy dose is about $1E^{15}/cm^2$.

* * * * *